(12) United States Patent
Nakamura et al.

(10) Patent No.: US 6,172,635 B1
(45) Date of Patent: Jan. 9, 2001

(54) HIGHLY ACCURATE A/D CONVERTER

(75) Inventors: Shoji Nakamura; Takashi Yoshikawa, both of Hyogo-ken (JP)

(73) Assignee: TOA Corporation, Hyogo-ken (JP)

( * ) Notice: Under 35 U.S.C. 154(b), the term of this patent shall be extended for 0 days.

(21) Appl. No.: 09/321,497

(22) Filed: May 27, 1999

(30) Foreign Application Priority Data

May 29, 1998 (JP) .................................................. 10-149844

(51) Int. Cl.$^7$ .................................................. H03M 1/12
(52) U.S. Cl. .................................................. 341/155
(58) Field of Search .................................. 341/155, 118, 341/119, 120, 158, 157

(56) References Cited

U.S. PATENT DOCUMENTS 4,940,982 * 7/1990 Gulczynski ........................ 341/169
4,985,702 * 1/1991 Penney ............................... 341/118

* cited by examiner

*Primary Examiner*—Brian Young
(74) *Attorney, Agent, or Firm*—Townsend and Townsend and Crew LLP

(57) ABSTRACT

An A/D converter provides a high conversion accuracy even when an input analog signal is at a low level. The A/D converter (10) comprises a first line including a first A/D conversion unit (ADC1) connected to an input terminal (1) applied with an analog signal, a second line including a first amplifier (AMP1) connected to the input terminal (1) and having an amplification ratio of $2^m$ (m>0), a second A/D conversion unit (ADC2), and a second amplifier (AMP2) having an amplification ratio of $2^{-m}$, and a combination of a switch and a level detector (SW, LDET) for connecting an output of the first line or an output of the second line to an output terminal (2) in accordance with an output level of the first line.

5 Claims, 4 Drawing Sheets

HIGHLY ACCURATE A/D CONVERTER

BACKGROUND OF THE INVENTION

The present invention relates to an analog-to-digital (A/D) converter which eliminates the need for accurate components but provides high conversion accuracy even when an analog signal input thereto is at a low level.

FIG. 1 schematically illustrates A/D conversion processing which has been conventionally performed in a variety of applications. An input analog signal is converted to a digital signal by an A/D converter having a resolution of N bits. In this event, the accuracy of the A/D conversion is determined by the number of bits N of the used A/D converter.

With the illustrated configuration, however, since only one A/D converter is used, the dynamic range is determined by the accuracy of the A/D converter. Therefore, a sufficient dynamic range cannot be ensured if an A/D converter with a low accuracy is used. On the contrary, when an accurate A/D converter is employed for ensuring a sufficient dynamic range, the cost of the entire apparatus is increased due to a high cost of the A/D converter itself.

In addition, in the A/D conversion processing illustrated in FIG. 1, noise produced by the A/D converter itself is often larger than quantization noise which is determined by the resolution of N bits. The noise produced by the A/D converter itself causes a higher noise floor, thereby degrading the dynamic range in consequence.

SUMMARY OF THE INVENTION

The present invention has been made to solve the problems mentioned above, and its object is to provide an A/D converter which is capable of performing highly accurate A/D conversion even with A/D conversion units of low accuracy, and capable of reducing a noise floor and thus improving the dynamic range.

To achieve the above object, the present invention provides an A/D converter which comprises:
- a first line including a first A/D conversion unit connected to an input terminal applied with an analog signal;
- a second line including a first amplifier connected to the input terminal and having an amplification ratio of $2^m$, where m>0, a second A/D conversion unit connected to an output of the first amplifier, and a second amplifier connected to an output of the second A/D conversion unit and having an amplification ratio of $2^{-m}$; and
- switching means for connecting either an output of the first line or an output of the second line to an output terminal in accordance with an output level of the first line.

The switching means may connect the output terminal to the output of the first line when the output level of the first line exceeds a predetermined switching level, and connect the output terminal to the output of the second line when the output level of the first line is below the predetermined switching level.

The switching means preferably has a cross fade characteristic for switching one of the first and second lines to the other such that the switching means gradually decreases an output level of the one line while it gradually increases an output level of the other line for a predetermined time period at the output terminal, and delivers an output of the other line from the output terminal after the lapse of the predetermined time period.

Also, the switching means preferably has a hysteresis characteristic having a first switching level for switching the output terminal from the output of the first line to the output of the second line, and a second switching level for switching the output terminal from the output of the second line to the output of the first line, where the second switching level is higher than the first switching level.

The A/D converter may further comprise at least one additional line comprising an amplifier connected to the input terminal and having an amplification ratio of $2^k$, where k>0 and k≠m, an A/D conversion unit connected to an output of the amplifier, and another amplifier connected to an output of the A/D conversion unit and having an amplification ratio of $2^{-k}$, such that the switching means connects the output terminal to either of outputs of the at least three lines connected to the switching means in accordance with the output level of the first line.

DETAILED DESCRIPTION OF THE INVENTION

An embodiment of an A/D converter according to the present invention will hereinafter be described with reference to FIGS. 2–4.

Figure 1:
FIG. 1 is a diagram illustrating conventional A/D conversion processing.
Figure 2:
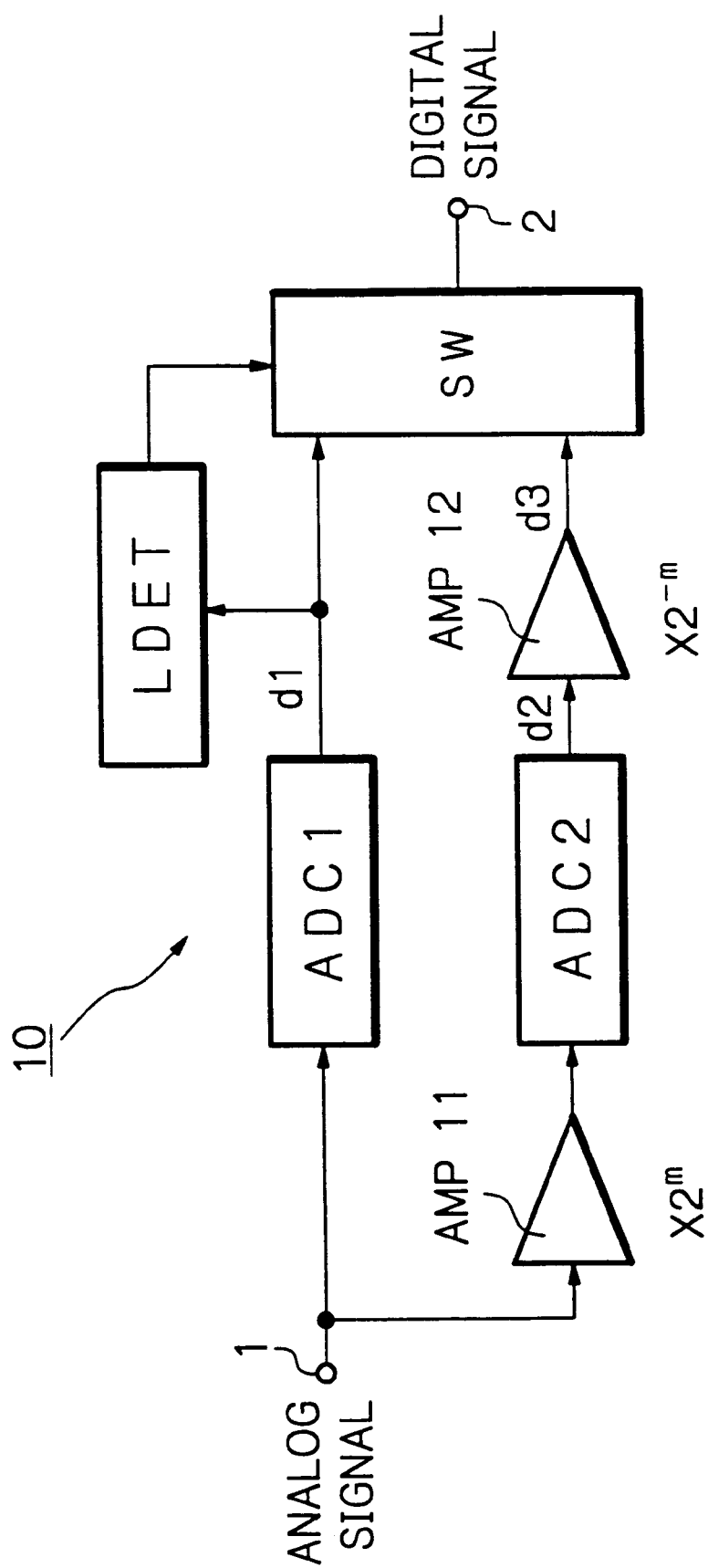
FIG. 2 is a block diagram generally illustrating the configuration of an embodiment of an A/D converter according to the present invention.

FIG. 2 is a block diagram generally illustrating the configuration of one embodiment of an A/D converter according to the present invention. The A/D converter 10 comprises an input terminal 1 which is applied with an analog signal to be converted, and an output terminal 2 which outputs a digital signal resulting from conversion of the analog signal.

The input terminal 1 is connected to respective inputs of a first A/D conversion unit ADC1 and a first amplifier AMP 11. The first A/D conversion unit ADC1 may be a low accuracy N-bit A/D converter, and the first amplifier AMP11 has an amplification ratio of $2^m$, where N is a positive integer, and m is a positive integer larger than zero. While m may not be an integer, m being an integer results in simpler calculations. For example, N is approximately 16, and m is approximately three in many cases for home use digital CD players.

An output of the first A/D conversion unit ADC1 is connected to an input of a level detector LDET and to a first contact of a switch SW. An output of the level detector LDET is connected to a control terminal of the switch SW. An output of the first amplifier AMP11 in turn is connected to an input of the second A/D conversion unit ADC2, while an output of the second A/D conversion unit ADC2 is connected to a second input contact of the switch SW through a second amplifier AMP12.

The second A/D conversion unit ADC2 may also be a low accuracy A/D converter, the resolution of which may be N bits, identical to the first A/D conversion unit ADC1, or may not be N bits. When the resolution is not N bits, the second A/D conversion unit ADC2 preferably has a resolution higher than that of the first A/D conversion unit. The second amplifier AMP12 has an amplification ratio set at $2^{-m}$. An output of the switch SW is connected to an output terminal 2.

Assuming now that an analog signal is applied to the input terminal 1, the analog signal is distributed to two lines, wherein the analog signal distributed to one line is converted to a digital signal d1 by the first A/D conversion unit ADC1, and output therefrom, while the analog signal distributed to the other line is amplified by a factor of $2^m$ by the first amplifier AMP11, converted to a digital signal d2 by the second A/D conversion unit ADC2, and output therefrom. The digital signal d2 is further input to the second amplifier AMP12 which amplifies it by a factor of $2^{-m}$ and outputs the amplified signal as a digital signal d3.

The digital signal d1 from the first A/D conversion unit ADC1 is applied to the level detector LDET and to the first input contact of the switch SW, while the digital signal d3 from the second amplifier AMP12 is applied to the second input contact of the switch SW. The level detector LDET monitors the level of the digital signal d1 output from the first A/D conversion unit ADC1, and sends a control signal to the switch SW to connect the first input contact of the switch SW with the output terminal 2 when it detects that the level of the digital signal d1 is equal to or higher than a predetermined switching level L, and sends another control signal to the switch SW to connect the second input contact of the switch SW with the output terminal 2 when the level of the digital signal d1 is lower than the predetermined switching level L. As a result, the digital signal d1 or the digital signal d3 is output from the output terminal 2 depending on whether the digital signal d1 output from the first A/D conversion unit ADC1 has a level higher or lower than the predetermined switching level L.

With the foregoing configuration, the second line including the first amplifier AMP11, the second A/D conversion unit ADC2 and the second amplifier AMP12 has a resultant conversion accuracy of N+m bits. Thus, the digital signal d3 from the second amplifier AMP12 is output from the output terminal 2 to reduce a noise floor when an input analog signal has a low level, so that the A/D conversion accuracy can be improved even with the low level of the input analog signal, thereby making it possible to improve the dynamic range.

In the configuration illustrated in FIG. 2, when the first A/D conversion unit ADC1 and the second A/D conversion unit ADC2 present variations in characteristics, switching noise may occur when the switch SW is switched between the first input contact and the second input contact. Thus, the switch SW is preferably provided with a mixer having a cross fade characteristic in order to prevent such switching noise. For this purpose, the switch SW may be configured, for example, such that the digital signal d1 output from the first A/D conversion unit ADC1 is applied to a first variable gain amplifier, while the digital signal d3 output from the second amplifier AMP12 is applied to a second variable gain amplifier, and outputs of these variable gain amplifiers are added and delivered to the output terminal 2.

Figure 3:
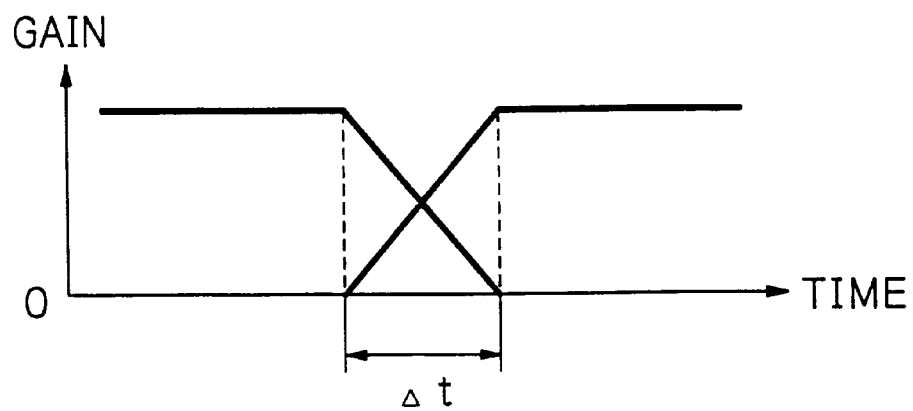
FIG. 3 is a graph illustrating an example of a cross fade characteristic which may be possessed by a switch in FIG. 2.

FIG. 3 illustrates changes in the gains, over time, of the first variable gain amplifier and the second variable gain amplifier in the switch SW having the cross fade characteristic as mentioned. When the level detector LDET detects that the level of the digital signal d1 is equal to or higher than the predetermined switching level L, the level detector LDET gradually reduces the second variable gain amplifier and gradually increases the gain of the first variable gain amplifier for a period of Δt seconds, as illustrated. Conversely, when the level detector LDET detects that the level of the digital signal d1 is lower than the predetermined switching level L, the level detector LDET gradually reduces the gain of the first variable gain amplifier and gradually increases the gain of the second variable gain amplifier for the period of Δt seconds. In this way, sudden switching is prevented between the first A/D conversion unit ADC1 and the second amplifier AMP12.

When the output level of the first A/D conversion unit ADC1 input to the switch SW fluctuates near the predetermined switching level L, this may cause the switch SW to frequently alternate between the output of the first A/D conversion unit ADC1 and the output of the second amplifier AMP2. To prevent this inconvenience, two different switching levels are preferably set for the switch SW to have a hysteresis characteristic.

Figure 4:
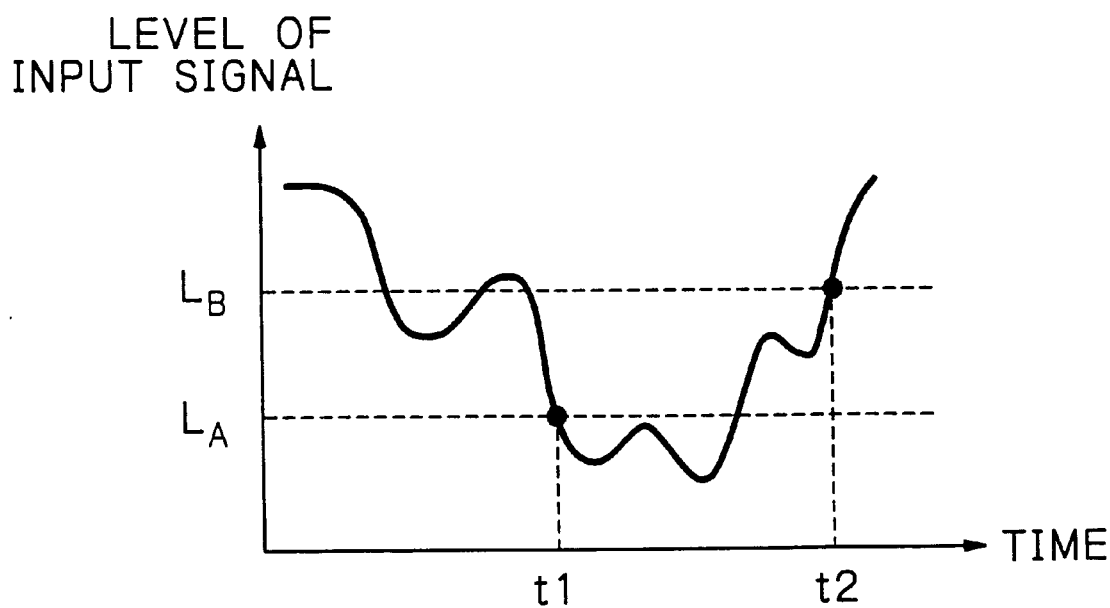
FIG. 4 is a graph illustrating an example of a hysteresis characteristic which may be possessed by the switch in FIG. 2.

FIG. 4 illustrates an example of the hysteresis characteristic as mentioned, where a lower switching level $L_A$ and a higher switching level $L_B$ are set for the switch SW. Referring specifically to FIG. 4 for discussing how the switch SW operates, the switch SW connects the output of the first conversion unit ADC1 to the output terminal 2 during a period in which the output level of the first A/D conversion unit ADC1 is higher than the lower switching level $L_A$ (until time t1), and connects the output of the second amplifier AMP2 to the output terminal 2 at the time the output level of the first A/D conversion unit ADC1 falls below the lower switching level $L_A$ (at time t1). Subsequently, the switch SW connects the output of the first A/D conversion unit AD1 to the output terminal 2 when the output level of the first A/D conversion unit ADC1 exceeds the higher switching level $L_B$ (at time t2). This prevents the switch SW from frequently alternating between the first A/D conversion unit ADC1 and the second amplifier AMP2 even if the output level of the first A/D conversion unit ADC1 fluctuates over time.

Figure 5:
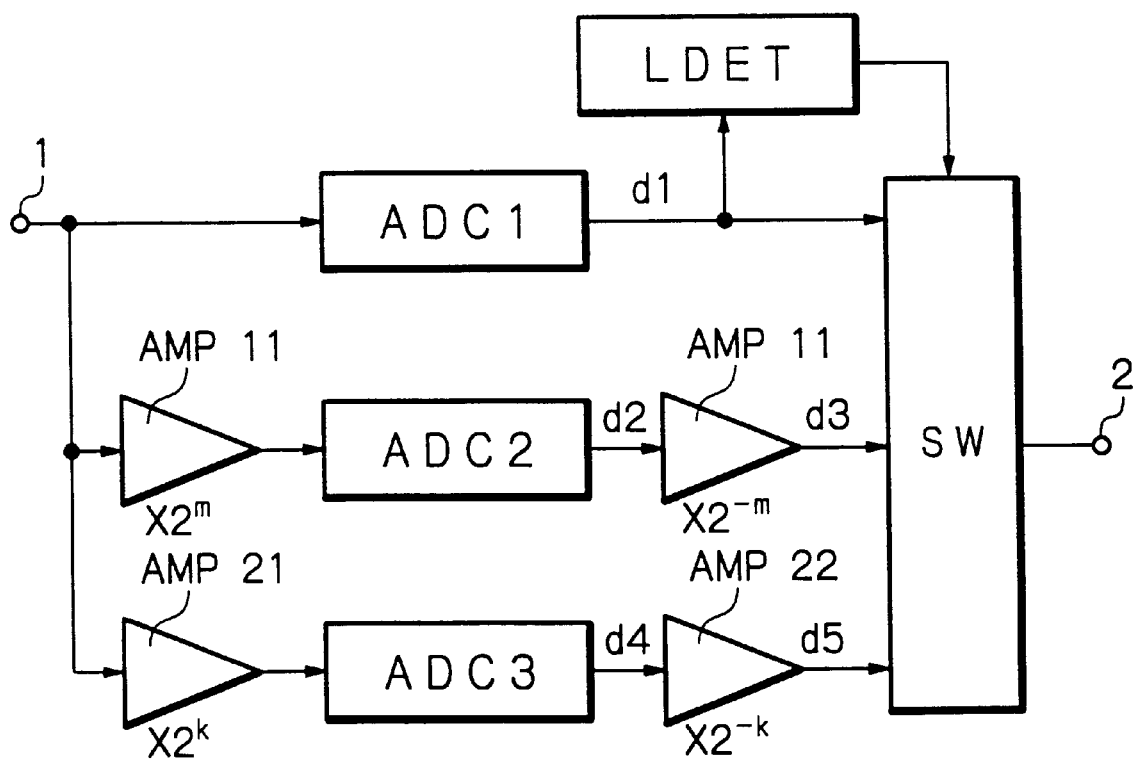
FIG. 5 is a block diagram generally illustrating the configuration of another embodiment of the A/D converter according to the present invention.

While the foregoing embodiment illustrated in FIG. 2 switches between two lines consisting of a line including the first A/D conversion unit ADC1 and another line including the second A/D conversion unit ADC2 to connect one of their outputs to the output terminal 2, the number of such lines is not limited to two. FIG. 5 is a block diagram generally illustrating another embodiment of the A/D converter according to the present invention which has a third line added to the first embodiment illustrated in FIG. 2. The third line comprises a third amplifier AMP21 connected to the input terminal 1 and having an amplification ratio of $2^k$, a third A/D conversion unit ADC3 which receives an output of the third amplifier AMP21, and a fourth amplifier AMP22 which receives an output of the third A/D conversion unit ADC3 and has an amplification ratio of $2^{-k}$. The fourth amplifier AMP22 has its output connected to a third input contact of the switch SW. Here, k and m are different positive integers.

The third A/D conversion unit ADC3 may also be a low accuracy A/D converter, and may or may not have a resolution of N bits, identical to that of the first A/D conversion unit ADC1. However, the third A/D conversion unit ADC3 preferably has a resolution higher than that of the first A/D conversion unit ADC1.

When an analog signal is applied to the input terminal 1, the first and second A/D conversion units ADC1, ADC2, the level detector LDET, and the first and second amplifiers AMP11, AMP12 operate in a manner similar to the embodiment illustrated in FIG. 2, as previously described, so that repetitive explanation is omitted here. The analog signal input to the input terminal 1 is amplified by a factor of $2^k$ by the third amplifier AMP21, converted to a digital signal d4 by the third A/D conversion unit ADC3, and output therefrom. The digital signal d4 is further input to the fourth amplifier AMP22 which amplifies the digital signal d4 by a factor of $2^{-k}$ and outputs the amplified signal as a digital signal d5.

The level detector LDET operates so as to:

(1) connect the first input contact of the switch SW to the output terminal 2 when it detects that the digital signal d1 output from the first A/D conversion unit ADC1 has an amplitude larger than the first switching level L1;

(2) connect the second input contact of the switch SW to the second terminal 2 when it detects that the digital signal d1 has an amplitude smaller than the first switching level L1 and larger than the second switching level L2; and (3) connect the third input contact of the switch SW to the output terminal 2 when it detects that the digital signal d1 has an amplitude smaller than the second switching level L2.

As a result, the digital signal d1, the digital signal d3 or the digital signal d5 is delivered from the output terminal 2 depending on whether the digital signal d1 output from the first A/D conversion unit ADC1 has a level higher or lower than the switching levels L1, L2.

With the foregoing configuration additionally comprising the third line having an improved conversion accuracy of N+k bits, which includes the third amplifier AMP21, the third A/D conversion unit ADC3 and the fourth amplifier AMP22, in addition to the second line having a conversion accuracy of N+m bits, when an input analog signal has a low level, the digital signal d3 of the second amplifier AMP12 or the digital signal d5 of the fourth embodiment AMP22 is delivered from the output terminal 2 to allow the noise floor to further decrease as compared with the embodiment of FIG. 2, thereby making it possible to improve the A/D conversion accuracy and the dynamic range even if an input analog signal is at a low level.

It will be apparent to those skilled in the art that the explanation on the embodiment illustrated in FIG. 5 similarly applies to an A/D converter which sets three or more switching levels in a switch SW and comprises three or more lines each including an A/D conversion unit and an amplifier. Thus, the A/D conversion accuracy and the dynamic range can be further improved even if an input signal becomes smaller.

As will be apparent from the embodiments of the A/D converter according to the present invention described above in detail, the present invention is particularly advantageous in that the conversion accuracy can be substantially improved when input signal has a low level, even if low accuracy A/D conversion units are used.

What is claimed is:

1. An A/D converter comprising:

a first line including a first AD conversion unit connected to an input terminal applied with an analog signal;

a second line including a first amplifier connected to said input terminal and having an amplification ratio of $2^m$, where m>0, a second A/D conversion unit connected to an output of said first amplifier, and a second amplifier connected to an output of said second A/D conversion unit and having an amplification ratio of $2^{-m}$; and switching means for connecting either an output of said first line or an output of said second line to an output terminal in accordance with an output level of said first line.

2. An A/D converter according to claim 1, wherein:

said switching means connects said output terminal to the output of said first line when the output level of said first line exceeds a predetermined switching level, and connects said output terminal to the output of said second line when the output level of said first line is below said predetermined switching level.

3. An A/D converter according to claim 2, wherein:

said switching means switches one of said first and second lines to the other such that said switching means gradually decreases an output level of said one line while it gradually increases an output level of the other for a predetermined time period at said output terminal, and delivers an output of said other line from said output terminal after the lapse of said predetermined time period.

4. An A/D converter according to claim 2, wherein:

said switching means has a first switching level for switching said output terminal from the output of said first line to the output of said second line, and a second switching level for switching said output terminal from the output of said second line to the output of said first line, said second switching level being higher than said first switching level.

5. An A/D converter according to claim 1, further comprising at least one additional line comprising an amplifier connected to said input terminal and having an amplification ratio of $2^k$, where k>0 and k≠m, an A/D conversion unit connected to an output of said amplifier, and another amplifier connected to an output of said A/D conversion unit and having an amplification ratio of $2^{-k}$, wherein said switching means connects said output terminal to either of outputs of said at least three lines connected to said switching means in accordance with the output level of said first line.

* * * * *